United States Patent [19]

Buuck et al.

[11] Patent Number: 5,568,107
[45] Date of Patent: Oct. 22, 1996

[54] TRANSMISSION LINE HAVING IMPEDANCE SET BY REFERENCE PLANE FENESTRATION

[75] Inventors: David C. Buuck, Santa Clara; Mark Gloster, Aptos, both of Calif.

[73] Assignee: Apple Computer, Inc., Cupertino, Calif.

[21] Appl. No.: 431,841

[22] Filed: May 1, 1995

[51] Int. Cl.⁶ .................................................. H01P 3/08
[52] U.S. Cl. ............................................ 333/238; 333/246
[58] Field of Search ................................ 333/1, 238, 246

[56] References Cited

U.S. PATENT DOCUMENTS 4,642,592  2/1987  Beeck ...................................... 333/246

5,479,138  12/1995  Kuroda et al. ............................... 333/1

FOREIGN PATENT DOCUMENTS 2444228  3/1976  Germany ................................ 333/238

*Primary Examiner*—Paul Gensler
*Attorney, Agent, or Firm*—Burns, Doane, Swecker & Mathis, L.L.P.

[57] ABSTRACT

An arrangement in which a transmission line on a multilayer printed circuit board has an impedance which is set by forming apertures or windows (fenestration) in a nearest conductive reference plane.

4 Claims, 5 Drawing Sheets

TRANSMISSION LINE HAVING IMPEDANCE SET BY REFERENCE PLANE FENESTRATION

BACKGROUND OF THE INVENTION

This invention relates to an arrangement for setting the impedance of a transmission line. In particular, it relates to an arrangement for setting the impedance of a circuit trace on a substrate such as a printed circuit board by introducing apertures in a conductive reference plane inside the board.

The impedance of a transmission line in the form of a conductive trace on a printed circuit board is determined by several factors. FIG. 1(a) is a schematic representation of a typical transmission line system. It includes a driver 10 with a characteristic impedance Zd, a transmission line 20 having a characteristic impedance Zl, and a receiving element or load 30 having a characteristic impedance Zr. An equivalent circuit for the line 20 itself is shown in FIG. 1(b). It includes a distributed series of circuits each made up of a characteristic inductance L, a characteristic ohmic resistance R, and a characteristic capacitive coupling C to other conductive bodies. At low frequencies, the impedance is dominated by the contribution of the ohmic resistance. At high frequencies, the reactance from the inductance and the capacitive coupling dominate the resistive component.

The conductive bodies of primary interest in connection with the capacitance of conductive traces on a printed circuit board are conductive reference planes such as a ground plane or a power plane located inside the board. This is illustrated in FIG. 2. FIG. 2 shows a substrate 40 having on it a first trace 50 and a second trace 60. A conductive reference plane 70 is located within the substrate 40. The capacitors shown in phantom indicate capacitive coupling between the traces 50 and 60 and the plane 70. The amount of capacitive coupling between the traces 50 and 60 and the plane 70 depends in general on the distance between the trace and the plane. A representative expression for the impedance of a PCB transmission line is:

$$Z = \frac{79}{\sqrt{e_r + 1.41}} \ln\left(\frac{5.98H}{.8W + T}\right)$$

where:

T is the trace thickness

W is the trace width $e_r$ is the relative dielectric constant of the substrate

H is the height of the trace above the reference plane.

For conventional traces, the trace and the plane are about 5 mils (0.005 inches) apart. This arrangement typically results in impedances on the order of 50 ohms.

One or more additional planes, represented by the plane 80, may also be present inside the board, but they are effectively shielded from the traces 50 and 60 by the plane 70 and so have no significant effect on the impedance of the traces 50 and 60.

Because the impedance is dictated by geometry and material choices, and because these parameters are in turn usually determined by other considerations, trace impedance has been taken as a given, and little effort has been made to control trace impedance other than to avoid discontinuities. In most instances, a specific board will have characteristic values for each of the dimensions and parameters discussed above and most traces on the board will have generally constant impedances per unit length. There are circumstances, however, where it is desirable to have a trace impedance which is other than that which occurs fortuitously. For example, the Small Computer System Interface (SCSI) protocol calls for transmission lines having an impedance of 102 to 110 ohms. However, using typical board specifications, various dimensions or materials would have to be modified to achieve such an impedance using conventional design methods. There is thus a need for a way to set the impedance of a transmission line without undue compromise of the other circuit design criteria.

SUMMARY OF THE INVENTION

These and other needs are met in the present invention through the provision of a transmission line which has an impedance which is set by forming apertures or windows (fenestrations) in a nearest conductive reference plane. The overall impedance is determined not only by the nearest reference plane, but also by whatever conductive body the transmission line "sees" through the window - in most cases, the next farthest conductive reference plane. This local increase in H raises the local impedance of the transmission line. By altering the size and placement of the windows, in effect, the effective EM transparency of the nearest conductive reference plane, the impedance can be adjusted to any of a range of values between the impedance without any apertures to the impedance if the nearest plane were absent.

In particular, in one embodiment, the invention may be regarded as being the combination of a substrate having an exterior surface, a circuit trace positioned on the exterior surface, and a first conductive reference plane positioned inside the substrate substantially parallel to and at a first distance away from the exterior surface and beneath at least part of the circuit trace. A second conductive reference plane is positioned inside the substrate substantially parallel to and at a second distance away from the exterior surface, the second distance being greater than the first distance, and beneath at least the part of the circuit trace. The first conductive reference plane has a plurality of apetures at positions beneath at least the part of the circuit trace. The spacing and size of the apertures are selected to determine an impedance of the part of the circuit trace.

The invention may also be regarded as a circuit arrangement combining a substrate having an exterior surface, a first circuit trace positioned on the exterior surface, and a second circuit trace positioned on the exterior surface. A first conductive reference plane is positioned inside the substrate substantially parallel to and at a first distance away from the exterior surface and beneath at least part of the first circuit trace and at least part of the second circuit trace. A second conductive reference plane is positioned inside the substrate substantially parallel to and at a second distance away from said exterior surface, the second distance being greater than the first distance, and beneath at least the part of the second circuit trace. In one preferred embodiment, the first circuit trace has an impedance in the range of about 45 to about 60 ohms. The first conductive reference plane has a plurality of apertures at positions beneath at least said part of said second circuit trace, the spacing and size of the apertures being selected such that the part of the second circuit trace has an impedance in the range of about 70 to about 140 ohms.

DETAILED DESCRIPTION OF PREFERRED EMBODIMENTS

Figure 1A:
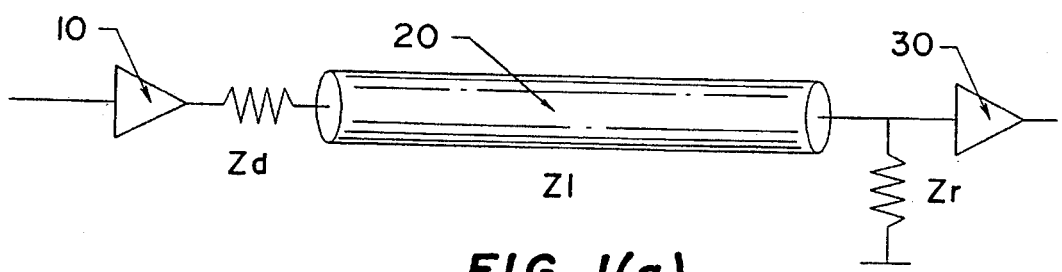
FIGS. 1(a) and 1(b) are diagrams for use in explaining principles underlying the invention.
Figure 1B:
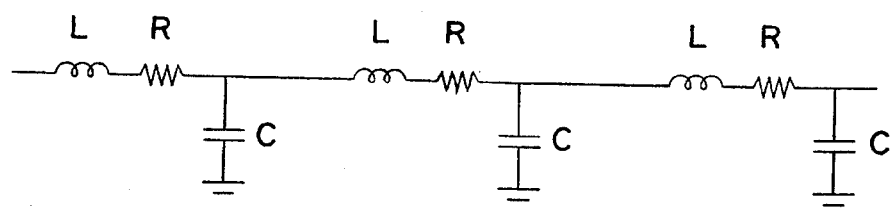
Figure 2:
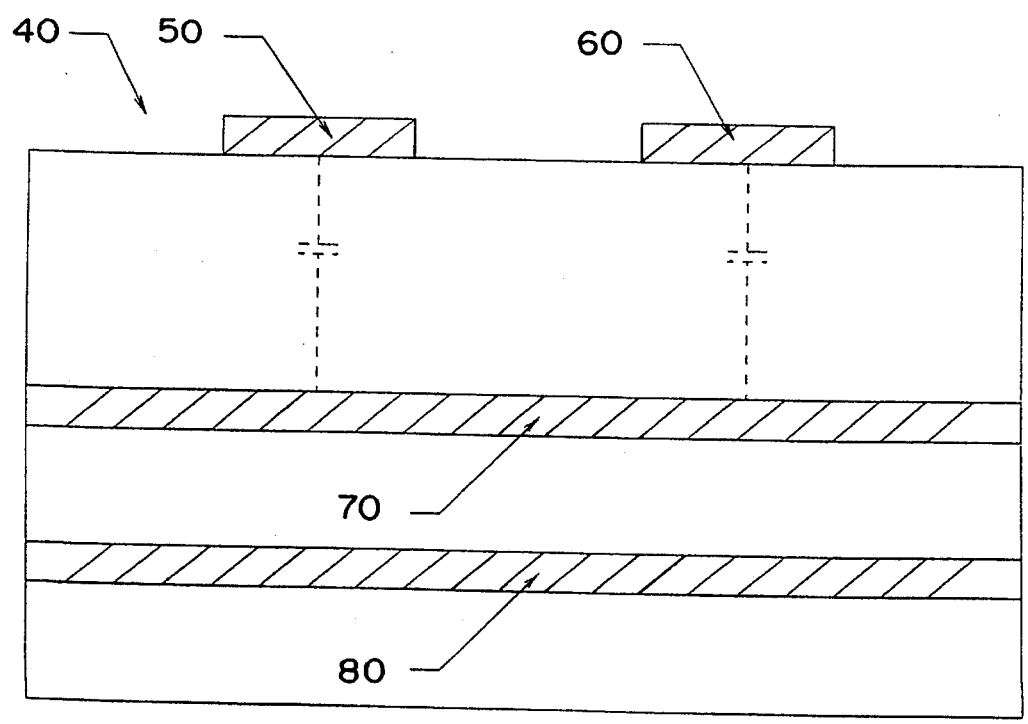
FIG. 2 is a cutaway view of a prior art multilayer printed circuit board.
Figure 3:
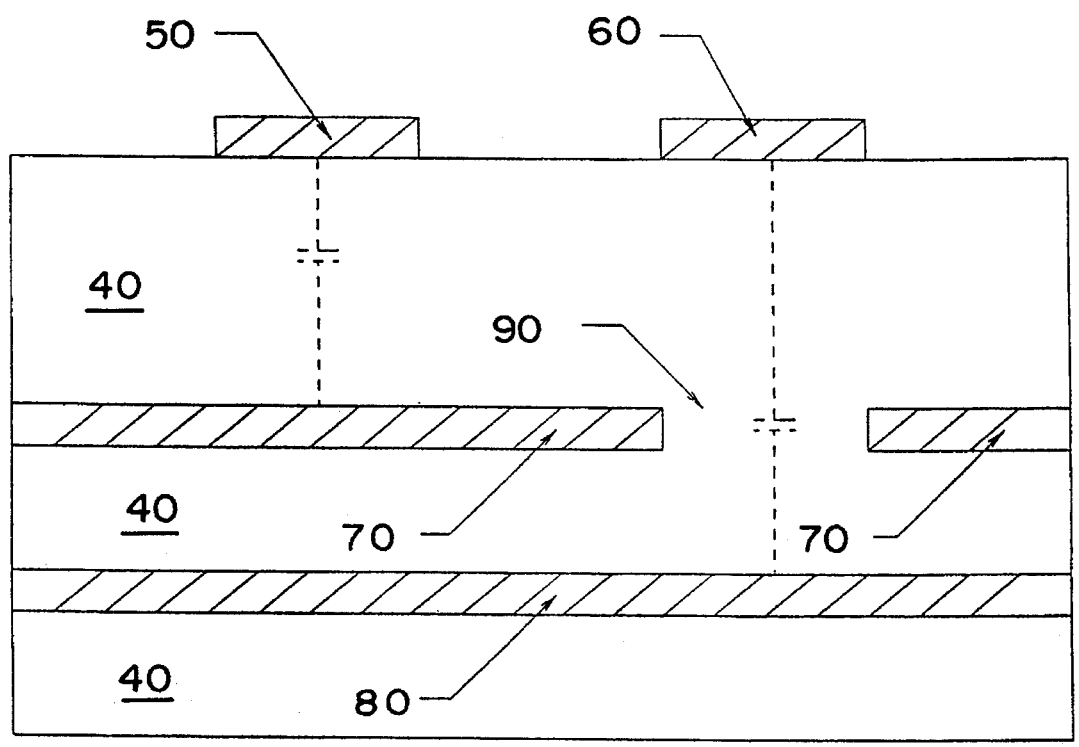
FIG. 3 is a cutaway view of multilayer printed circuit board incorporating a first embodiment of the invention.

FIG. 3 is a cutaway view of an exemplary embodiment of the invention. The plane 70 has a window or aperture 90 which permits the underlying plane 80 to influence the impedance of the trace 60. The net impedance is thus affected by both plane 70 and plane 80. The relative effect of each plane depends on the size, placement, number, and shape of the window 90. In the extreme case of no window, the impedance is determined solely by the plane 70. As the size of the window increases, the effect of the plane 70 diminishes as the effect of the plane 80 increases, until, in the limit, only plane 80 has any significant influence on the impedance of the trace 60. The impedance of the trace 60 can thus theoretically be adjusted between the no window case (approximately 50 ohms) and the no intermediate plane case (typically about 140 ohms). As a practical matter, this easily encompasses values in the SCSI range of 102 to 100 ohms.

Figure 4:
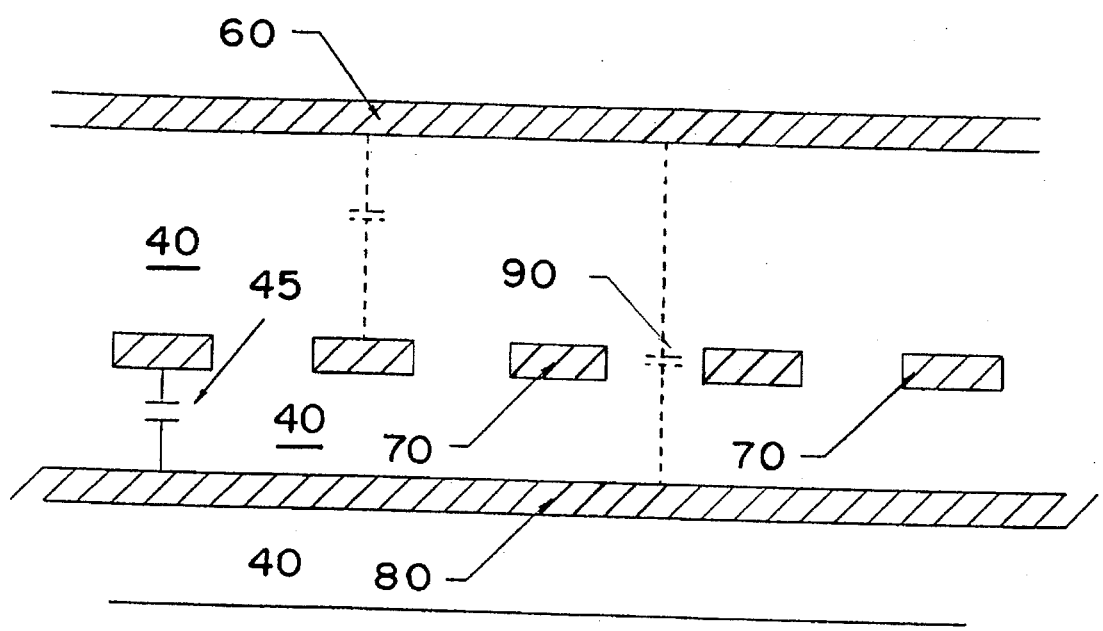
FIG. 4 is a cutaway view of a multilayer primed circuit board incorporating a second embodiment of the invention.

In general, it is envisioned that the conductive reference plane 70 will have multiple windows 90 under trace 60, as shown in FIG. 4. These windows 90 will in general extend in a pattern which is lengthwise with respect to the trace 60, and may also extend in a pattern transversely of the length of the trace 60. The trace 60 thus travels over an expanse of "plane near" alternated with "plane far", both levels being tightly AC-coupled (as indicated by capacitor 45) and loosely DC-coupled. The ratio of alternation, and the respective values for impedance for each plane, set a final, composite value with contributions from each plane.

Figure 5:
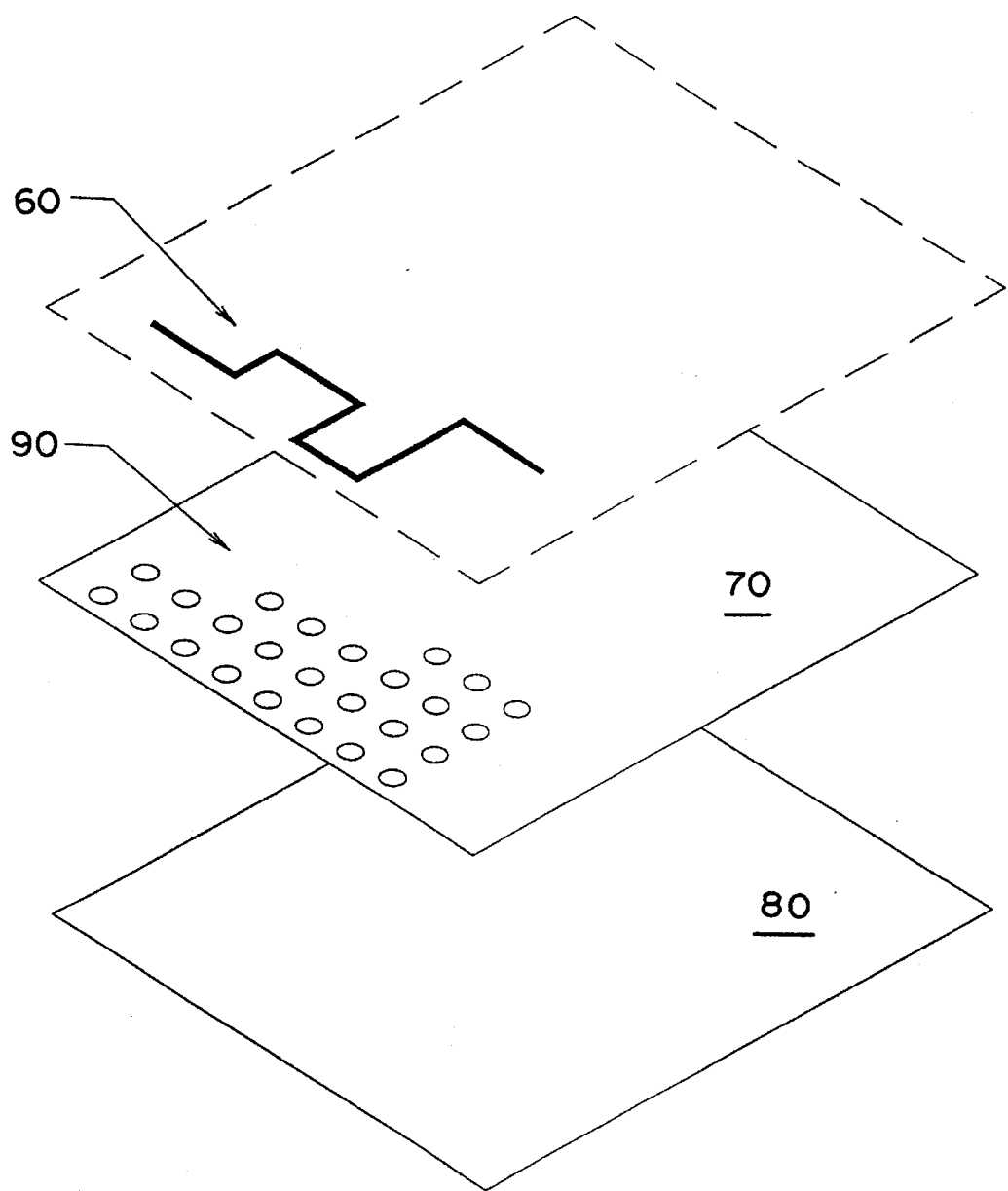
FIG. 5 is a perspective view of multilayer printed circuit board incorporating the second embodiment of the invention.

FIG. 5 is an exploded view of an arrangement according to the invention with the body of the substrate omitted and the top surface shown only in phantom. In the embodiment shown, a pattern of apertures 90 in the plane 70 are positioned beneath the trace 60. The apertures 90 together influence the impedance of the trace 60 by partially exposing it to the plane 80. In the arrangement shown, impedance is a function not only of the size of the apertures but their spacing and number as well. In general, the impedance will be a function of the trace 60's net distributed capacitance with respect to plane 70 in parallel with its net distributed capacitance with respect to plane 80. The net distributed capacitance with respect to the plane 70 will decrease as the apertures 90 become larger, or are spaced more tightly, or increase in number. The net distributed capacitance with respect to the plane 80 will increase, but is smaller in the limit, so that the net effect of capacitance is that it will decrease, thus increasing impedance.

In terms of the size of the holes, it is presently believed that larger holes may be sufficient for narrowband signals, but that for wider band signals, smaller holes are required. Thus, it is envisioned that the invention in one preferred embodiment would take the form of a near plane having a larger number of relatively small holes.

The arrangement according to the invention for adjusting transmission line impedance has several advantages over prior art methods. Implementation is inexpensive. It is also precise and repeatable, the latter because it is not subject to variations in processing conditions. Impedance adjustment according to the invention is also relatively insensitive to fluctuations in operating environment such as heat, and are stable over the passage of time.

The invention has been described above in terms of specific embodiments. These specific embodiments have been described purely for the purposes of making the description concrete. They are intended to be illustrative rather than exhaustive. The scope of the invention should therefore not be regarded as being limited to these embodiments, but should instead be regarded as being fully commensurate in scope with the following claims.

What is claimed is:

1. A circuit arrangement comprising:

substrate having an exterior surface;

a circuit trace positioned on said exterior surface;

a first conductive reference plane positioned inside said substrate substantially parallel to and at a first distance away from said exterior surface and beneath at least part of said circuit trace; and a second conductive reference plane positioned inside said substrate substantially parallel to and at a second distance away from said exterior surface, said second distance being greater than said first distance, and beneath at least said part of said circuit trace;

said first conductive reference plane having a plurality of apertures at positions beneath at least said part of said circuit trace to expose said circuit trace to corresponding portions of said second conductive reference plane lying beneath said apertures, the spacing and size of said apertures being selected to determine an impedance of said part of said circuit trace.

2. The circuit arrangement of claim 1 wherein said impedance is in the range of about 102 to about 110 ohms.

3. A circuit arrangement comprising:

substrate having an exterior surface;

a first circuit trace positioned on said exterior surface;

a second circuit trace positioned on said exterior surface;

a first conductive reference plane positioned inside said substrate substantially parallel to and at a first distance away from said exterior surface and beneath at least part of said first circuit trace and at least part of said second circuit trace; and a second conductive reference plane positioned inside said substrate substantially parallel to and at a second distance away from said exterior surface, said second distance being greater than said first distance, and beneath at least said part of said second circuit trace;

said part of said first circuit trace having an impedance in the range of about 45 to about 60 ohms;

said first conductive reference plane having a plurality of apertures at positions beneath at least said part of said second circuit trace, the spacing and size of said apertures being selected such that said part of said second circuit trace has an impedance in the range of about 70 to about 140 ohms.

4. A circuit arrangement as claimed in claim 3 wherein said part of said second circuit trace has an impedance in the range of about 102 to about 110 ohms.

* * * * *